(12) United States Patent
Lee et al.

(10) Patent No.: US 7,742,333 B2
(45) Date of Patent: Jun. 22, 2010

(54) MAGNETIC MEMORY DEVICE USING DOMAIN STRUCTURE AND MULTI-STATE OF FERROMAGNETIC MATERIAL

(75) Inventors: Sang-Hoon Lee, Seoul (KR); Dong-Yun Shin, Seoul (KR)

(73) Assignee: Korea University Industrial & Academic Collaboration Foundation, Seoul (KR)

( * ) Notice: Subject to any disclaimer, the term of this patent is extended or adjusted under 35 U.S.C. 154(b) by 429 days.

(21) Appl. No.: 11/956,925

(22) Filed: Dec. 14, 2007

(65) Prior Publication Data

US 2009/0003042 A1 Jan. 1, 2009

(30) Foreign Application Priority Data

Jun. 29, 2007 (KR) ............. 10-2007-0065460

(51) Int. Cl.
*G11C 11/18* (2006.01)
(52) U.S. Cl. ............................ 365/170
(58) Field of Classification Search ............ 365/48, 365/55, 62, 66, 74, 78, 80–93, 100, 130, 365/131, 148, 158, 170, 171–173, 225.5, 365/243.5; 216/22; 257/421, E21.665; 438/3; 977/933–935
See application file for complete search history.

(56) References Cited

U.S. PATENT DOCUMENTS

| | | | | |
|---|---|---|---|---|
| 5,089,991 A | * | 2/1992 | Matthews | 365/9 |
| 5,289,410 A | * | 2/1994 | Katti et al. | 365/170 |
| 5,652,445 A | * | 7/1997 | Johnson | 257/295 |
| 5,926,414 A | * | 7/1999 | McDowell et al. | 365/170 |
| 6,483,741 B1 | * | 11/2002 | Iwasaki et al. | 365/170 |
| 6,809,959 B2 | * | 10/2004 | Johnson | 365/170 |
| 6,870,761 B2 | * | 3/2005 | Johnson | 365/158 |
| 6,894,920 B2 | * | 5/2005 | Kim et al. | 365/158 |
| 7,193,891 B2 | * | 3/2007 | Johnson | 365/158 |
| 7,215,570 B2 | * | 5/2007 | Johnson | 365/158 |
| 7,376,007 B2 | * | 5/2008 | Stephenson et al. | 365/171 |

* cited by examiner

*Primary Examiner*—Richard Elms
*Assistant Examiner*—Harry W Byrne
(74) *Attorney, Agent, or Firm*—Locke Lord Bissell & Liddell LLP (57) ABSTRACT

Disclosed is a memory device using a multi-domain state of a semiconductor material, and more particularly to a magnetic memory device, in which a ferromagnetic layer for recording magnetic data serves as a sensing layer so as to have a simple structure, shorten a manufacturing process, and reduce the unit cost of production. The planar hall effect or magneto-resistance is used to measure multi-domain states so as to read data stored in a multi-level state.

8 Claims, 7 Drawing Sheets

| Input pulses | | | PHE | Logic States |
|---|---|---|---|---|
| $I_H$ | $I_L$ | Sequences | $V_{xy}/I_s$ | $V_{xy}/I_s$ |
| +1 | -1 | | $R_4$ | "3" |
| -1 | +1 | | $R_2$ | "1" |
| +1 | 0 | | $R_3$ | "2" |
| -1 | 0 | | $R_1$ | "0" |

MAGNETIC MEMORY DEVICE USING DOMAIN STRUCTURE AND MULTI-STATE OF FERROMAGNETIC MATERIAL

BACKGROUND OF THE INVENTION

1. Field of the Invention

The present invention relates to a memory device using a multi-domain states of a ferromagnetic material, and more particularly to a magnetic memory device, in which a ferromagnetic layer for recording magnetic data serves as a sensing layer so as to have a simple structure, shorten a manufacturing process, and reduce the unit cost of production. The planar hall effect or magneto-resistance is used to measure multi-domain states so as to read data stored in a multi-level state.

The present invention relates generally to a memory device designed for memory or data storage. It also is related generally to electronic device which uses single or multi-domain states of ferromagnetic material for data storage. Particularly, this magnetic memory device is composed of thin ferromagnetic film which acts as recording layer as well as sensing layer, resulting in simple structure, shortened manufacturing process, and reduced cost of production. This device reads information data by measuring planar Hall effect or magneto-resistance on multi-domain states of ferromagnetic film and writes information data by external magnetic field generated by extra metal wires.

2. Description of the Related Art

Generally, magnetic memory devices have been recognized as memory devices, which can be substituted for dynamic-RAMs (DRAMs), static-RAMs (SRAMs), flash memories, etc., and will be widely used in mobile instruments, such as smart cards, mobile terminals, and portable telephones, as well as computers.

DRAMs, which are most widely used now, are volatile memories that lose all stored data when the power is shut off, and thus require a long time to operate the DRAMs back to in an initial state. In order to solve the above drawback, Fe (ferroelectric) RAMs are proposed. The Fe RAMs are in a commercially usable state, but require a high voltage in an initial state and have a complicated structure. Magnetic-RAMs (MRAMs) solve the above disadvantages. It has high operation speed at low voltage, and thus are prosperously researched now.

Figure 1:
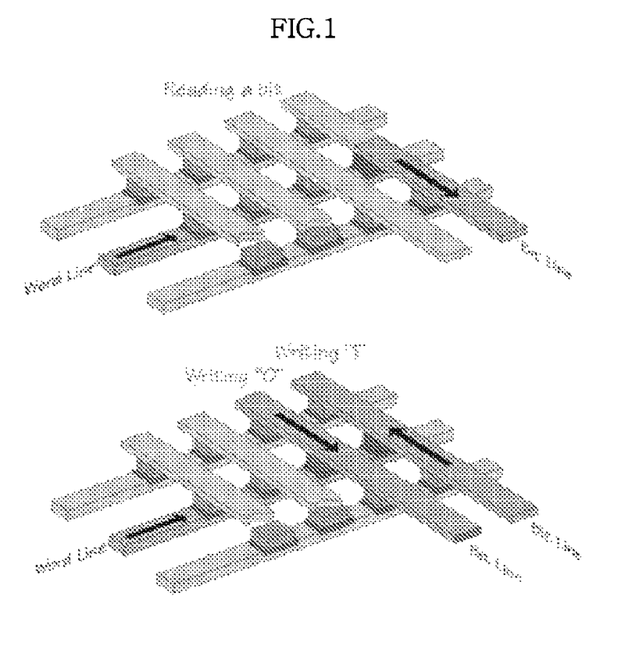
FIG. 1 is a schematic view of a conventional MRAM device.

FIG. 1 is a schematic view of a conventional MRAM device.

With reference to FIG. 1, the conventional MRAM device uses a giant magneto-resistance (GMR) effect such that resistance is highly varied when two top and bottom magnetic layers interposed by a non-magnetic layer have different spin directions in comparison with the same spin directions. The device has a complex structure with the multiple magnetic layers based on a spin valve structure.

The conventional MRAM device includes a hard magnetic layer formed under a space layer and serving to perform a sensing function, and a soft magnetic layer formed on the space layer and serving to perform a storing function.

Here, the magnetization direction of the soft magnetic layer is written by applying current along word lines and a variation of resistance due to the magnetization directions of the two magnetic layers is sensed. Thus, the information bits according to the magnetization directions of two layers are written.

However, the conventional MRAM device has a complicated structure due to the multiple magnetic layers forming spin valves and layers firming word lines and read lines, thus having problems, such as a difficulty in a manufacturing process and deterioration in productivity.

Further, since data stored in one cell are 1 bit data representing "0" and "1", the conventional MRAM device stores a small amount of data in spite of the complicated structure.

SUMMERY OF THE INVENTION

Therefore, the present invention has been made in view of the above problems, and it is an object of the present invention to provide a magnetic memory device using a ferromagnetic materials (FM) having a stable multi-domain state, which has a reduced thickness and shortens a manufacturing process so as to increase an efficiency in the process.

It is another object of the present invention to provide a magnetic memory device using the stable single or multi-domain state of ferromagnetic materials (FM), which stores data of 4 states or more in one cell so as to increase a storage capacity and a processing speed of the device.

In accordance with one aspect of the present invention, the above and other objects can be accomplished by the provision of a magnetic memory device using a domain structure and single or multi-state of a ferromagnetic material comprising a substrate; a ferromagnetic layer formed on the substrate, and storing and sensing the single or multi-state through a planar hall effect or magneto-resistance; an insulating film formed on the ferromagnetic layer; first current lines formed on the insulating film; an insulating film formed on the first current lines; and second current lines formed on the insulating film.

In accordance with another aspect of the present invention, there is provided a magnetic memory device using a domain structure and single or multi-state of a ferromagnetic material comprising a substrate; first current lines formed on the substrate; an insulating film formed on the first current lines; a ferromagnetic layer formed on the insulating film, and storing and sensing multi-data through a planar hall effect or magneto-resistance using a single or multi-domain state; an insulating film formed on the ferromagnetic layer; and second current lines formed on the insulating film.

The ferromagnetic layer may apply current in a pulse mode to cells, in which the first current lines and the second current lines cross each other, and thus form an induced magnetic field, and adjust a direction and a strength of the magnetic field and thus make the ferromagnetic material having magnetic anisotropy be in a single or multi-domain state in a writing operation; and the ferromagnetic layer may record a planar hall resistance value or a magneto-resistance value of the multi-state varied according to the single domain or multi-domain state and thus store multi-data.

In the multi-domain state, the broken degree of multi-domains may be adjusted according to the direction and the strength of the magnetic field, and be checked using the planar hall resistance value or the magneto-resistance value.

The ferromagnetic semiconductor layer may apply sensing current to the current lines and thus read the stored planar hall resistance value or magneto-resistance value in a reading operation.

The planar hall resistance value may be calculated by the below equation:

$$R_{xy} = \frac{k}{t}M^2\sin2\phi$$

here, k is a difference of specific resistance values when a direction of current is perpendicular to a magnetization direction and when the direction of current is parallel with the magnetization direction, and t is a thickness of a sample.

The magneto-resistance value may be calculated by the below equation:

$$R_{xx} = R_\perp + (R_{//} - R_\perp)\cos^2\phi$$

here, $R_\perp$ is a resistance value of a ferromagnetic material when an external magnetic field is perpendicular to a direction of current, $R_{//}$ is a resistance value of the ferromagnetic material when the external magnetic field is parallel with the direction of current, and $\emptyset$ is a magnetization direction.

The ferromagnetic layer may be made to have bi-axial anisotropy such as GaMnAs ferromagnetic semiconductor, LCMO (LaCaMnO) compounds La or ferromagnetic metal on specific substrates.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Now, preferred embodiments of the present invention will be described in detail with reference to the annexed drawings.

Figure 2:
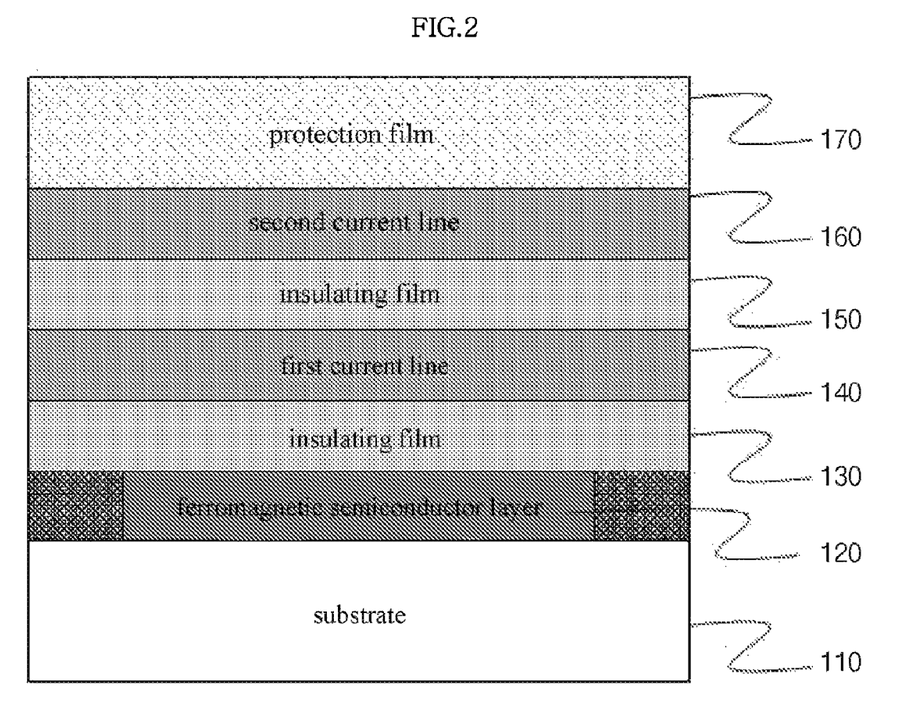
FIG. 2 is a schematic sectional view of a magnetic memory device in accordance with a first embodiment of the present invention.
Figure 3:
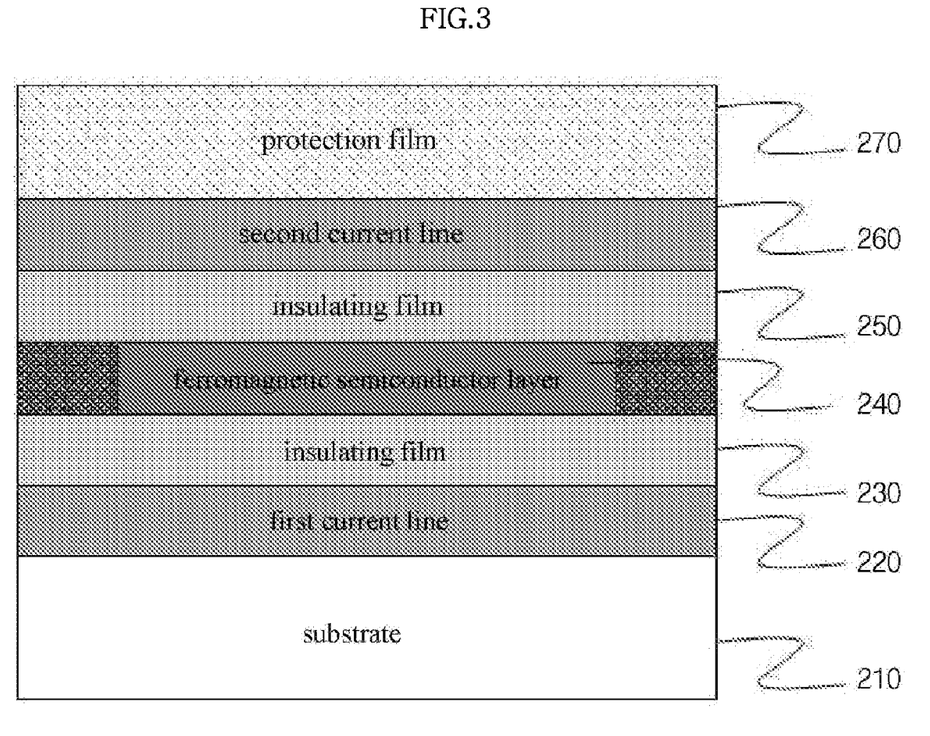
FIG. 3 is a schematic sectional view of a magnetic memory device in accordance with a second embodiment of the present invention.

FIG. 2 is a schematic sectional view of a magnetic memory device in accordance with a first embodiment of the present invention, and FIG. 3 is a schematic sectional view of a magnetic memory device in accordance with a second embodiment of the present invention.

With reference to FIG. 2, the magnetic memory device in accordance with the first embodiment of the present invention includes a substrate 110, a ferromagnetic layer 120 formed on the substrate 110, an insulating film 130 formed on the ferromagnetic layer 120, first current lines 140 formed on the insulating film 130, an insulating film 150 formed on the first current lines 140, second current lines 160 formed on the insulating film 150, and a protection film 170 formed on the second current lines 160.

With reference to FIG. 3, the magnetic memory device in accordance with the second embodiment of the present invention includes a substrate 210, first current lines 220 formed on the substrate 210, an insulating film 230 formed on the first current lines 220, a ferromagnetic layer 240 formed on the insulating film 230, an insulating film 250 formed on the ferromagnetic layer 240, second current lines 260 formed on the insulating film 250, and a protection film 270 formed on the second current lines 260.

Here, the ferromagnetic layers 120 and 240 serve to store and sense multi-data through a planar hall effect or magneto-resistance using a single domain state or a multi-domain state.

The ferromagnetic layers 120 and 240 are made of a magnetic material having high magnetic anisotropy, such as an III-V magnetic semiconductor (GaMnAs), perovskite (LaCaMnO) or metal film on specific substrate.

Hereinafter, a structure of the magnetic memory device is apparent to those skilled in the art, and thus a detailed description of the magnetic memory device will be omitted and a configuration and functions of the ferromagnetic layer corresponding to the point of the present invention will be described.

The present invention uses a planar hall effect or magneto-resistance, which is found in a ferromagnetic thin films having in-plnae magnetization, instead of a giant magneto-resistance (GMR) effect of a spin valve structure, so as to alternate the conventional MRAM having relatively complicated structure of multi-layers.

More specifically, a single domain state refers to a state, in which a ferromagnetic material is magnetized in the same direction. However, most ferromagnetic materials cannot have the above state.

A multi-domain state refers to a state, in which a ferromagnetic material has domain walls. In this case, magnetization directions of respective domains are different.

Particularly, ferromagnetic materials showing in-plane bi-axial magnetic anisotropy have four magnetization directions on a plane.

Figure 4:
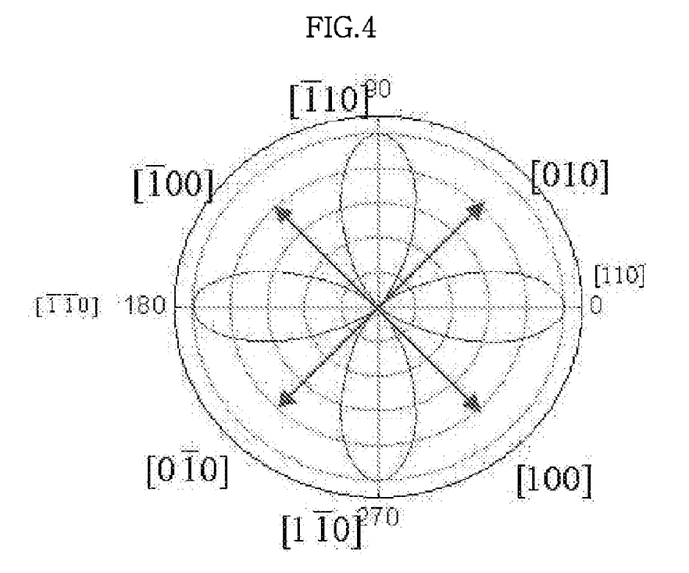
FIG. 4 is a view illustrating four magnetization directions of a ferromagnetic layer at an angle, where the magnetic energy is minimized.
Figure 5:
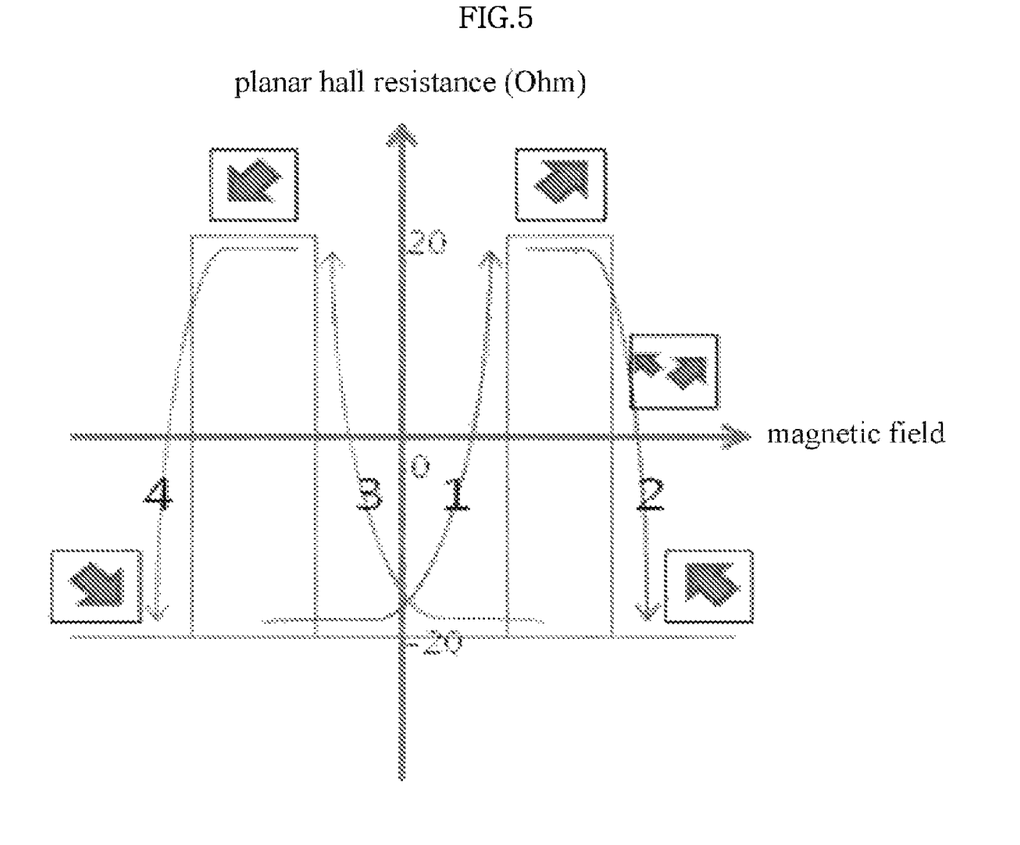
FIG. 5 is a graph schematically illustrating a hysteresis curve, in which a planar hall resistance value is varied according to magnetization directions in scanning an external magnetic field in a single domain state.

FIG. 4 is a view illustrating four magnetization directions of a ferromagnetic semiconductor at an angle, where the magnetic energy is minimized, and FIG. 5 is a graph schematically illustrating a hysteresis curve, in which a planar hall resistance value is varied according to magnetization directions in scanning an external magnetic field in a single domain state. In FIG. 5, arrows 1, 2, 3, and 4 represent magnetic field scanning directions, and thick arrows represent magnetization directions corresponding to resistance states.

With reference to FIGS. 4 and 5, data are stored in the two magnetization states having high resistance values (i.e., [010] ↗ and [0̄10] ↙) and two magnetization states having low resistance values (i.e., [1̄00] ↖ and [100] ↘). That is, four kinds of data can be stored.

A single ferromagnetic semiconductor layer achieves states corresponding to four combinations (for example, high resistance states (⇌ (10) and ⇋ (01)) and low resistance states (⇐ (00) and ⇒ (11)) obtained by a conventional spin valve structure having triple magnetic layers.

However, among the above four magnetization states, the resistance values of the two magnetization states (i.e., [010] ↗ and [0̄10] ↙) and the resistance values of the two magnetization states (i.e., [$\bar{1}$00] ↖ and [100] ↘ ) are the same, and thus a complicated process is required to read stored data.

In order to solve the above problem, four states using a multi-domain structure are recorded.

A multi-domain state is formed in the case that an external magnetic force applied to the middle portion of a single domain state having different magnetization directions is disappeared when the single domain state is rotated at an angle of 90 degrees. In FIG. 5, a middle planar hall resistance value of the magnetization direction 2 corresponds to the multi-domain state.

Each of domains of the multi-domain state is magnetized in a direction, in which the domain is easily magnetized among the above four magnetization directions. The total magnetization value of the multi-domain state is the sum of vectors of the respective domains.

For example, in a ferromagnetic body having magnetic anisotropy including domains having angles of 45 and 135 degrees, when the area ratio of the domains is defined as p:1−p, the total magnetization amount (M) expressed by the sum of the vectors of the domains is $$M = \sqrt{p^2 + (1-p)^2} |M_{total}|, \text{ and}$$

the total magnetization direction (Ø) is $$\phi = \tan^{-1}\left(\frac{1-p}{p}\right) + \frac{\pi}{4}.$$

Figure 6:
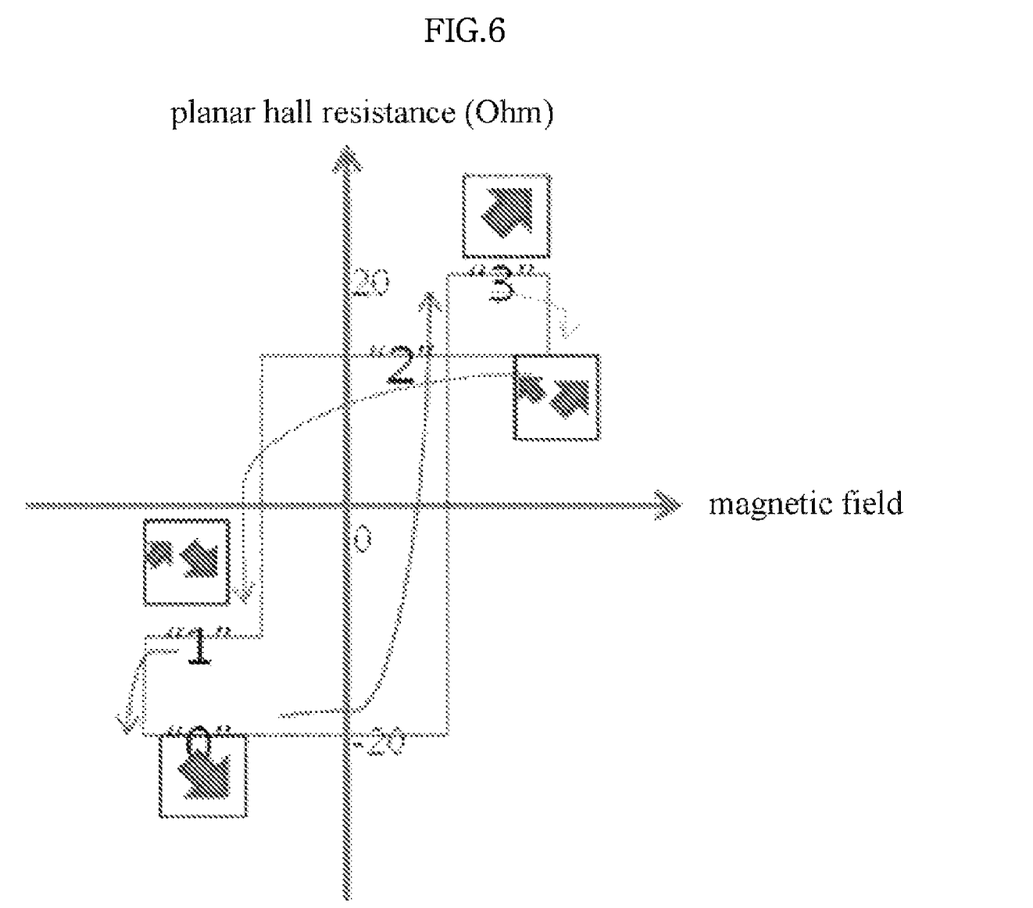
FIG. 6 is a graph illustrating a hysteresis curve in a multi-domain state in accordance with a preferred embodiment of the present invention.

FIG. 6 is a graph illustrating a hysteresis curve in a multi-domain state in accordance with a preferred embodiment of the present invention.

In the case that a multi-domain state occurs, the broken degree of domains is checked using a planar hall resistance value or a magneto-resistance value.

With reference to FIG. 6, it is understood that four resistance values (states "0", "1", "2", and "3") are in individually different states through the hysteresis curve exhibiting a planar hall effect in that a magnetic conversion between a single domain state and a multi-domain state occurs.

Here, the logic states "0", "1", "2", and "3" respectively correspond to logic states ⇌ (10), ⇋ (01), ⇐ (00), and ⇒ (11) of the spin valve structure of a magnetic body.

Among the different planar hall resistance values, the states "0" and "3" represent the single domain state, and the states "1" and "2" represent the multi-domain state.

Accordingly, a ferromagnetic material having magnetic anisotropy is converted between a single domain state and a multi-domain state by adjusting the direction (Ø) and the strength (M) of an external magnetic field, and a planar hall resistance value due to the above magnetic conversion is stored and thus different resistance values of four states can be stored.

Here, the planar hall resistance value is calculated by the below equation.

$$R_{xy} = \frac{k}{t} M^2 \sin 2\phi$$

Here, k is a difference of specific resistance values when a direction of current is perpendicular to a magnetization direction and when the direction of current is parallel with the magnetization direction, and t is a thickness of a sample.

Consequently, four different resistance values are obtained using the single domain state and the multi-domain state of a ferromagnetic semiconductor, and data stored as the resistance values are read directly. Thus, this structure of the present invention more simply achieves a process for reading data, compared with the spin valve structure of a magnetic body.

The above effect based on the planar hall resistance can be obtained also using magneto-resistance.

In the case that the magneto-resistance is used, a magneto-resistance value is calculated by the below equation.

$$R_{xx} = R_\perp + (R_{//} - R_\perp) \cos^2 \phi$$

Here, $R_\perp$ is a resistance value of a ferromagnetic material when an external magnetic field is perpendicular to a direction of current, $R_{//}$ is a resistance value of the ferromagnetic material when the external magnetic field is parallel with the direction of current, ($R_{//} - R_\perp$) is a function of the magnetization amount (M), and thus the magneto-resistance value is varied according to the single domain state or the multi-domain state, like the planar hall resistance value.

Embodiment

Figure 7:
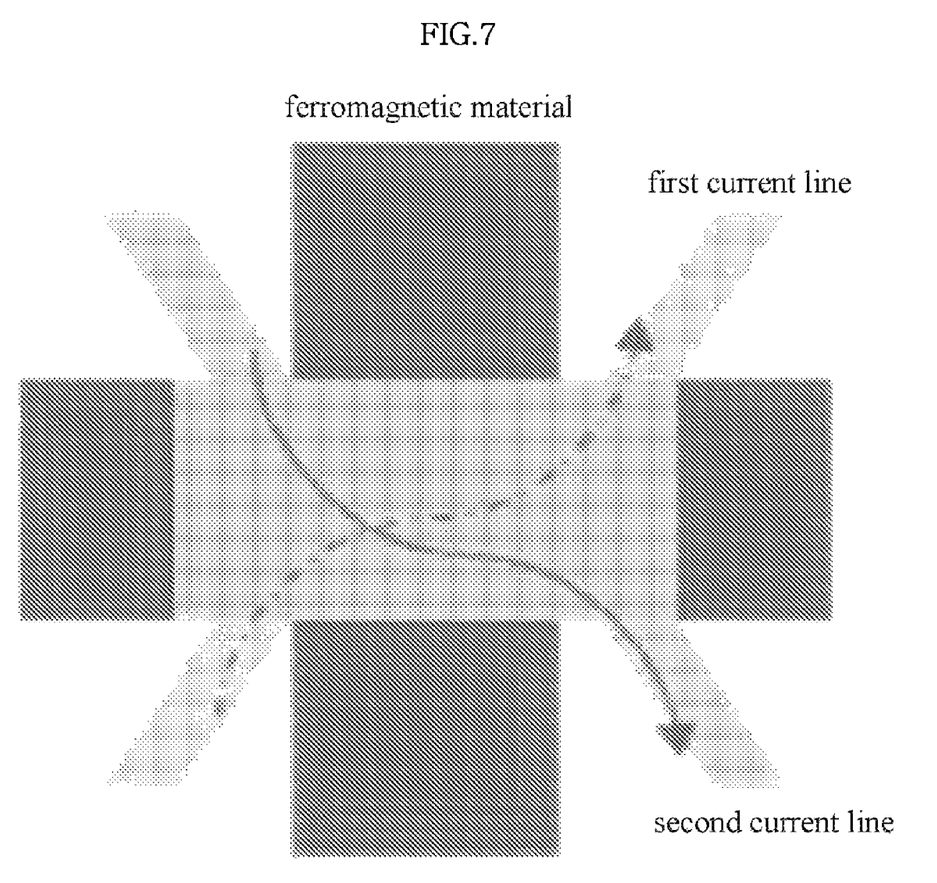
FIG. 7 is a schematic view illustrating a structure for forming an induced magnetic field in accordance with the present invention.

An external magnetic field for forming a single domain state or a multi-domain state is substituted by an induced magnetic field, obtained by forming current lines on a ferromagnetic semiconductor layer. FIG. 7 is a schematic view illustrating a structure for forming an induced magnetic field in accordance with the present invention, and FIG. 8 is a schematic view illustrating the formation of an induced magnetic field of a magnetic memory device in accordance with a preferred embodiment of the present invention.

Figure 8:
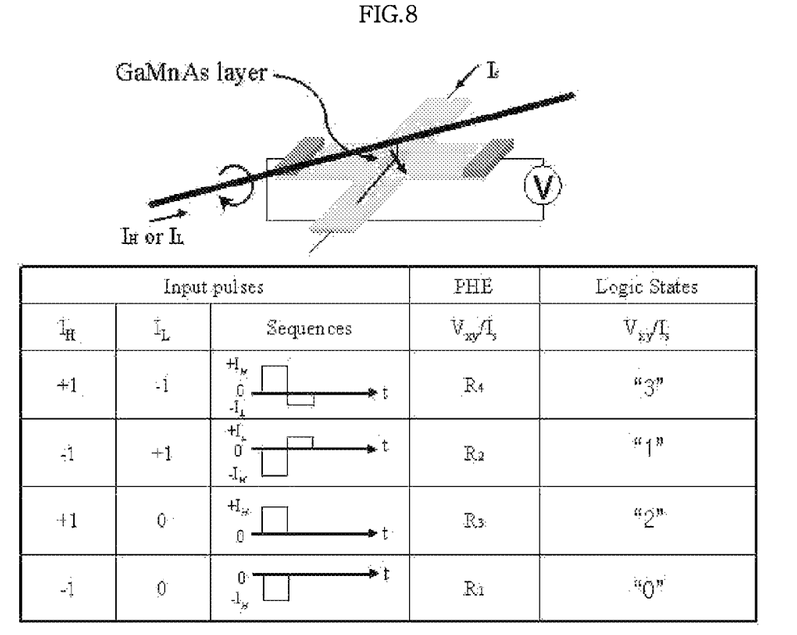
FIG. 8 is a schematic view illustrating the formation of an induced magnetic field of a magnetic memory device in accordance with a preferred embodiment of the present invention.

With reference to FIGS. 7 and 8, current lines, distinguished from each other by an insulating layer, are formed in cells for storing data, and current in a pulse mode flows into the cells, in which the current lines cross each other, thereby forming an induced magnetic field and thus allowing data to be recorded in the cells.

That is, when the current is adjusted to the pulse mode, the induced magnetic field is formed around the current lines and a planar hall resistance value is varied according to a domain state (a single domain state or a multi-domain state) adjusted by a current pulse. The value of current is controlled to a specific amount in order to induce enough magnetic field at a memory cell to change the magnetic states.

Figure 9:
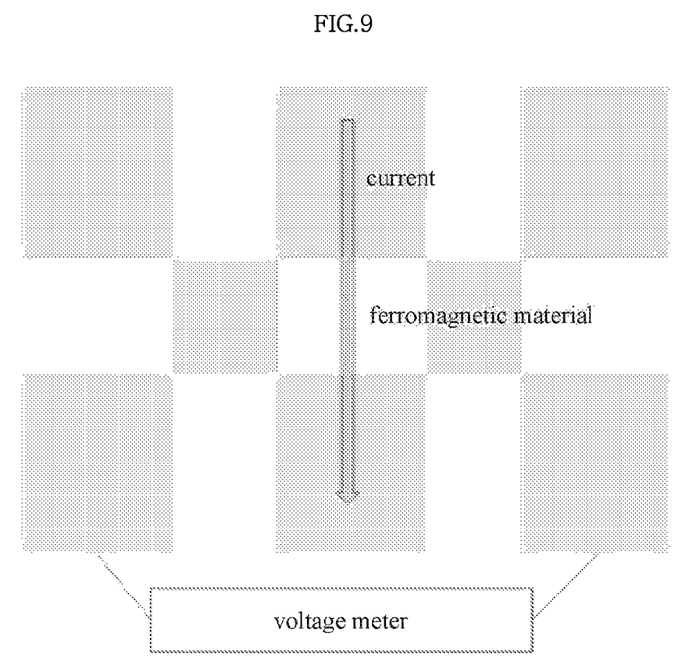
FIG. 9 is a view illustrating a method for measuring a planar hall resistance value in accordance with the present invention.
Figure 10:
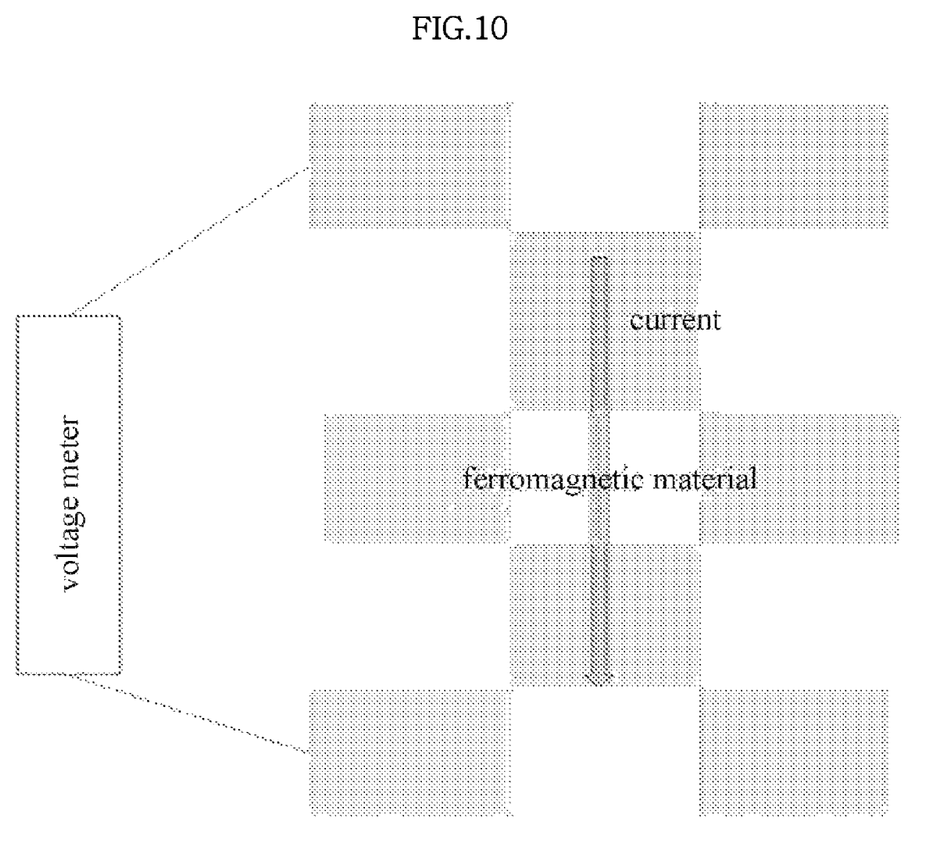
FIG. 10 is a view illustrating a method for measuring a magneto-resistance value in accordance with the present invention.

FIG. 9 is a view illustrating a method for measuring a planar hall resistance value in accordance with the present invention, and FIG. 10 is a view illustrating a method for measuring a magneto-resistance value in accordance with the present invention.

With reference to FIGS. 9 and 10, an insulating layer is formed on a cross-shaped ferromagnetic semiconductor layer, first current lines are formed on the insulating layer, another insulating layer is formed on the first current lines, and second current lines are formed on the insulating layer.

A strong induced magnetic field is formed on the central region of the cross-shaped area of the ferromagnetic semiconductor layer, in which current flows along the first and second current lines simultaneously, and thus converts the domain state of a ferromagnetic material. Further, data (four states) can be stored in the ferromagnetic semiconductor layer by the above method.

The above stored data are read by measuring the planar hall resistance value or the magneto-resistance value through a sensing current. Accordingly, the single ferromagnetic semiconductor layer serves to perform a sensing function and a storing function simultaneously.

As apparent from the above description, the present invention provides a magnetic memory device using a multi-domain state of a ferromagnetic material, in which multiple resistance values are stored in one cell using excellent magnetic anisotropy of a magnetic materials so as to increase the storage capacity of the memory device, and requires only a single magnetic semiconductor layer, compared with a spin valve memory device having a triple structure, so as to have a simple structure, thus increasing an efficiency in a manufacturing process and facilitating high integration.

Further, the magnetic memory device of the present invention simplifies procedures for writing and reading data, thus having a high enhancement in an operation speed.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A magnetic memory device using a domain structure and multi-state of a ferromagnetic material comprising:
    a substrate;
    a ferromagnetic thin film layer formed on the substrate, and storing and sensing the multi-state through a planar hall effect or magneto-resistance using a multi-domain state;
    an insulating film formed on the ferromagnetic thin film layer;
    first current lines formed on the insulating film;
    an insulating film formed on the first current lines; and
    second current lines formed on the insulating film.

2. A magnetic memory device using a domain structure and multi-state of a ferromagnetic material comprising:
    a substrate;
    first current lines formed on the substrate;
    an insulating film formed on the first current lines;
    a ferromagnetic layer formed on the insulating film, and storing and sensing multi-data through a planar hall effect or magneto-resistance using a single domain or multi-domain state;
    an insulating film formed on the ferromagnetic layer; and
    second current lines formed on the insulating film.

3. The magnetic memory device according to claim 1 or 2, wherein:
    the ferromagnetic layer applies current in a pulse mode to cells, in which the first current lines and the second current lines cross each other, and thus forms an induced magnetic field, and adjusts a direction and a strength of the magnetic field and thus makes the ferromagnetic material having magnetic anisotropy be in a single domain or multi-domain state in a writing operation; and
    the ferromagnetic layer records a planar hall resistance value or a magneto-resistance value of the multi-state varied according to the single domain or multi-domain state and thus stores multi-data.

4. The magnetic memory device according to claim 3, wherein in the multi-domain state, the broken degree of multi-domains is adjusted according to the direction and the strength of the magnetic field, and is checked using the planar hall resistance value or the magneto-resistance value.

5. The magnetic memory device according to claim 1 or 2, wherein the ferromagnetic layer applies sensing current to the current lines and thus reads the stored planar hall resistance value or magneto-resistance value in a reading operation.

6. The magnetic memory device according to claim 5, wherein the planar hall resistance value is calculated by the below equation:

$$R_{xy} = \frac{k}{t} M^2 \sin 2\phi$$

here, k is a difference of specific resistance values when a direction of current is perpendicular to a magnetization direction and when the direction of current is parallel with the magnetization direction, and t is a thickness of a sample.

7. The magnetic memory device according to claim 5, wherein the magneto-resistance value is calculated by the below equation:

$$R_{xx} = R_\perp + (R_{//} - R_\perp)\cos^2\phi$$

here, $R_\perp$ is a resistance value of a ferromagnetic material when an external magnetic field is perpendicular to a direction of current, $R_{//}$ is a resistance value of the ferromagnetic material when the external magnetic field is parallel with the direction of current, and Ø is a magnetization direction.

8. The magnetic memory device according to claim 1 or 2, wherein the ferromagnetic layer is made of ferromagnetic metal or ferromagnetic semiconductor film.

* * * * *